(12) United States Patent
Yee

(10) Patent No.: US 7,055,117 B2
(45) Date of Patent: May 30, 2006

(54) SYSTEM AND METHOD FOR DEBUGGING SYSTEM-ON-CHIPS USING SINGLE OR N-CYCLE STEPPING

(75) Inventor: Oceager P. Yee, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 221 days.

(21) Appl. No.: 10/748,068

(22) Filed: Dec. 29, 2003

(65) Prior Publication Data

US 2005/0149892 A1 Jul. 7, 2005

(51) Int. Cl.
*G06F 17/50* (2006.01)

(52) U.S. Cl. .................................. 716/4; 716/5; 716/1
(58) Field of Classification Search .................. 716/4, 716/5, 1

See application file for complete search history.

(56) References Cited

U.S. PATENT DOCUMENTS

| | | | |
|---|---|---|---|
| 5,675,729 A * | 10/1997 | Mehring | 714/37 |
| 5,678,003 A | 10/1997 | Brooks | 714/34 |
| 5,812,562 A | 9/1998 | Baeg | 714/726 |
| 6,249,893 B1 | 6/2001 | Rajsuman et al. | 714/741 |
| 6,385,742 B1 | 5/2002 | Kirsch et al. | 714/39 |
| 6,484,280 B1 | 11/2002 | Moberly | 714/726 |
| 6,519,711 B1 | 2/2003 | Fischer et al. | 714/30 |
| 6,754,852 B1 * | 6/2004 | Swoboda | 714/39 |
| 2002/0138801 A1 | 9/2002 | Wang et al. | 714/729 |

FOREIGN PATENT DOCUMENTS

GB 2 337 834 A 1/1999

WO WO 03/065065 A1 7/2003

OTHER PUBLICATIONS

"Silicon Debug: Scan Chains Alone Are Not Enough" by Gert Jan van Rootselaar and Bart Vermeulen; ITC International Test Conference; 1999 IEEE, pp. 892-902.

"Hierarchical Data Invalidation Analysis for Scan-Based Debug on Multiple-Clock System Chips" by Sandeep Kumar Goel and Bart Vermeulen; ITC International Test Conference; 2002 IEEE, pp. 1103-1110.

"Test and Debug Techniques for Multiple Clock Domain SoC Devices" by Ross R. Youngblood, Electronics Manufacturing Technology Symposium, 2004 IEEE, pp. 202-205.

* cited by examiner

Primary Examiner—Sun James Lin
(74) Attorney, Agent, or Firm—Synnestvedt Lechner & Woodbridge LLP

(57) ABSTRACT

Large, complex SoCs comprise interconnections of various functional blocks, which blocks frequently running on different clock domains. By effectively controlling the clocks within the SoC, this invention provides a means to halt execution of a SoC and to then single or n-cycle step its execution in a real system environment. Accordingly, the invention provides an effective debugging tool to both the SoC designer and software designers whose code is executed by the SoC as it provides them the capability of studying the cause and effect of interactions between functional blocks. The invention is also applicable to SoCs containing only one functional block while containing complex circuitry operating on a clock different than the block's clock. In particular, the invention permits halting of the block clock and then single or n-cycle stepping its execution to permit analysis of the interactions between the block and the SoC circuitry.

19 Claims, 8 Drawing Sheets

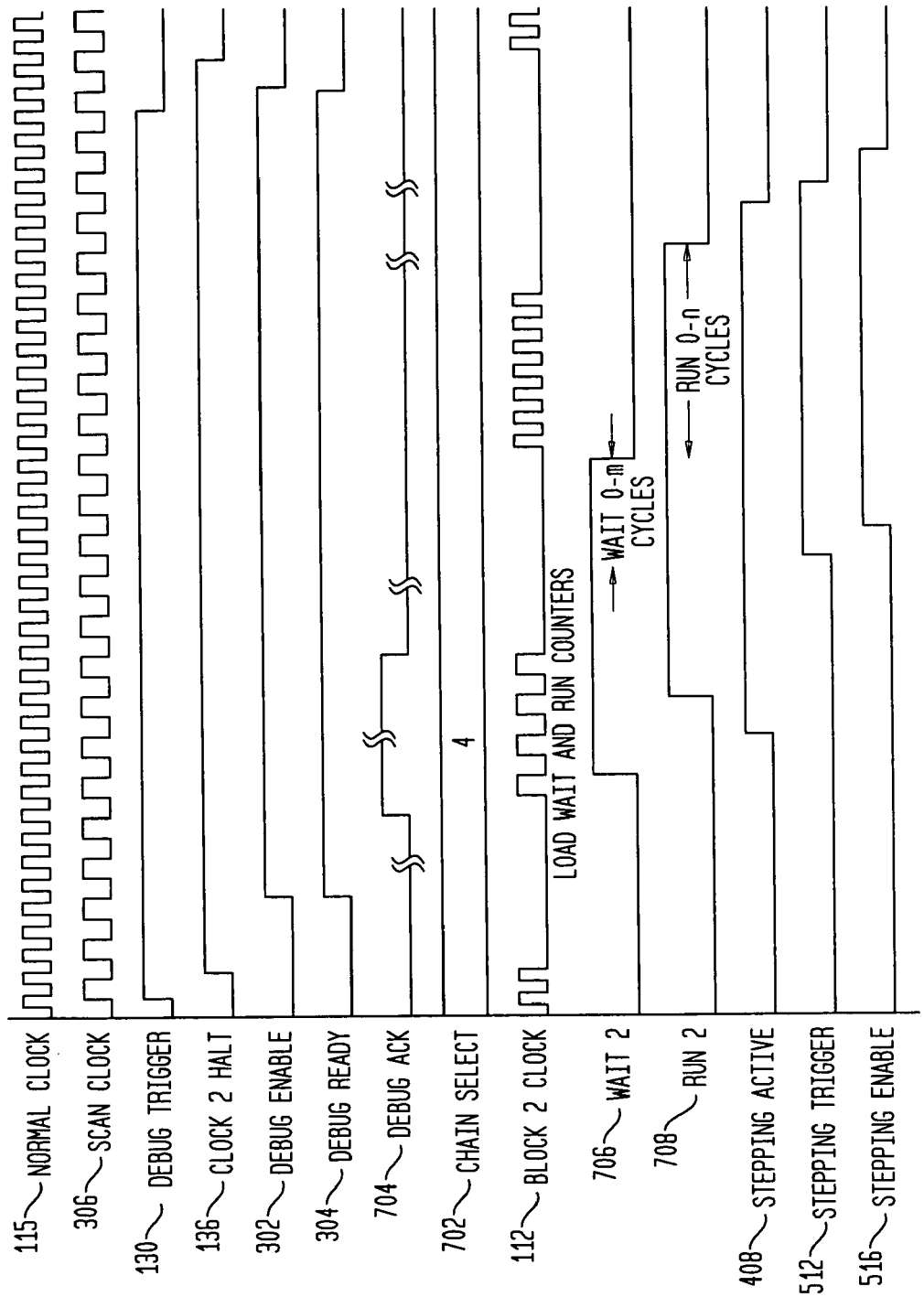

SYSTEM AND METHOD FOR DEBUGGING SYSTEM-ON-CHIPS USING SINGLE OR N-CYCLE STEPPING

FIELD OF THE INVENTION

The present invention relates to a system and method for debugging embedded cores based system-on-chips (SoCs), and more particularly, to a system and method for debugging complex SoCs by using single cycle or n-cycle stepping in a real system environment.

BACKGROUND OF THE INVENTION

Since the 1990's, integrated circuit (IC) design has evolved from a chip-set philosophy to an embedded core based SoC concept. An SoC IC includes various reusable functional blocks, such as microprocessors, interfaces, memory arrays, and DSPs (digital signal processors). Such pre-designed functional blocks are commonly called "IP cores," "cores," or "blocks", and are collectively referred to herein as "functional blocks," or simply, "blocks." The resulting SoCs have become quite complex. Moreover, the techniques used in the design of these SoCs have not scaled with the complexities of chip designs. That is, SoCs are currently designed by lumping functional blocks from different vendors into a single design and then functionally verifying the interfaces between these blocks.

Debugging SoCs can be a difficult task after a design has been fabricated. This difficulty is due to the numerous possible interactions between different functional blocks. Quite often, the type of problems that go undetected during the design process are those that involve interactions between different functional blocks. Designers typically write exhaustive functional tests to verify the functionality of their designs in a standalone environment. When the functional block is integrated, additional functional tests are then written to check the interface to the block. However, these tests are non-exhaustive, system-level tests. The lack of system-level tests is due to the limited understanding that a block designer has of the system in which his block will be used.

When functional problems do occur with fabricated SoCs, designers attempt to determine the cause by observing the state of internal registers, internal memories, or the output signals presented at the pins to the device (e.g., by various means such as test probing of device pins as well as more sophisticated methods employing computer driven debugging interfaces). Frequently, this is accompanied by well known prior art debugging techniques such as breakpointing. Breakpointing is a concept used in microprocessor design to allow software designers to efficiently debug their code. The designer sets a breakpoint on an instruction to be executed by the microprocessor. Prior to the microprocessor executing that instruction, instruction flow is halted, and the microprocessor enters debug mode.

Single-cycle stepping or n-cycle stepping is another debugging concept that is used in conjunction with breakpointing to allow software designers to efficiently debug their code. The designer sets a breakpoint on an instruction to be executed by the microprocessor. As described above, prior to the microprocessor executing that instruction, instruction flow is halted, and the microprocessor enters debug mode. To allow single-stepping, a breakpoint is set on the following instruction, and the microprocessor is released from debug mode to execute the current instruction before entering debug mode again. Similarly, for n-cycle stepping, a breakpoint is set on the instruction that is n-instructions ahead.

These prior art debugging techniques are not readily applicable to complex SoCs. This dilemma can be attributed to there being multiple blocks running on different clock domains, and each block potentially having its own method for halting the execution. Current SoCs have separated the breakpointing mechanisms of different functional blocks to simplify the design process. This design approach hampers the designer when debugging failures on SoCs. In particular, the designer needs to halt each functional block separately, and as a result, there is no control over the entire SoC device up to the point of failure.

Further, for such complex SoCs, there is no previously described technique to single or n-cycle step the entire SoC. Again, this dilemma can be attributed to there being multiple blocks running on different clock domains, as well as each block potentially having its own method for single or n-cycle stepping the execution.

The present invention overcomes these problems in the prior art by providing a means to halt the execution of a SoC and to provide a means to single or n-cycle step the execution of the SoC by effectively controlling the clocks within the SoC.

SUMMARY OF THE INVENTION

Large, complex SoCs comprise interconnections of various functional blocks, which blocks frequently running on different clock domains. By effectively controlling the clocks within the SoC, this invention provides a means to halt execution of a SoC and to then single or n-cycle step its execution in a real system environment. Accordingly, the invention provides an effective debugging tool to both the SoC designer and software designers whose code is executed by the SoC as it provides them the capability of studying the cause and effect of interactions between functional blocks.

The invention is also applicable to SoCs containing only one functional block while containing complex circuitry operating on a clock different than the block clock. The invention permits halting of the block clock and then single or n-cycle step it execution to again permit analysis of the interactions between the block and the SoC circuitry.

This current invention works in conjunction with co-pending U.S. patent application entitled "System and Method for Debugging System-on-Chips" to provide a useful means for debugging complex SoCs. In this co-pending application, incorporated herein by reference, observability of the internal state of the blocks contained on the SoC is provided.

BRIEF DESCRIPTION OF THE DRAWINGS

Various embodiments of the present invention will now be described in detail in conjunction with the annexed drawings, in which:

FIG. 7 is an illustration of an exemplary timing operation for single and n-cycle stepping of SoC in accordance with an embodiment of the invention; and, FIGS. 8A and 8B are illustrations of exemplary I/O interfaces to a debugging system in accordance with an embodiment of the invention.

DETAILED DESCRIPTION

Figure 1:
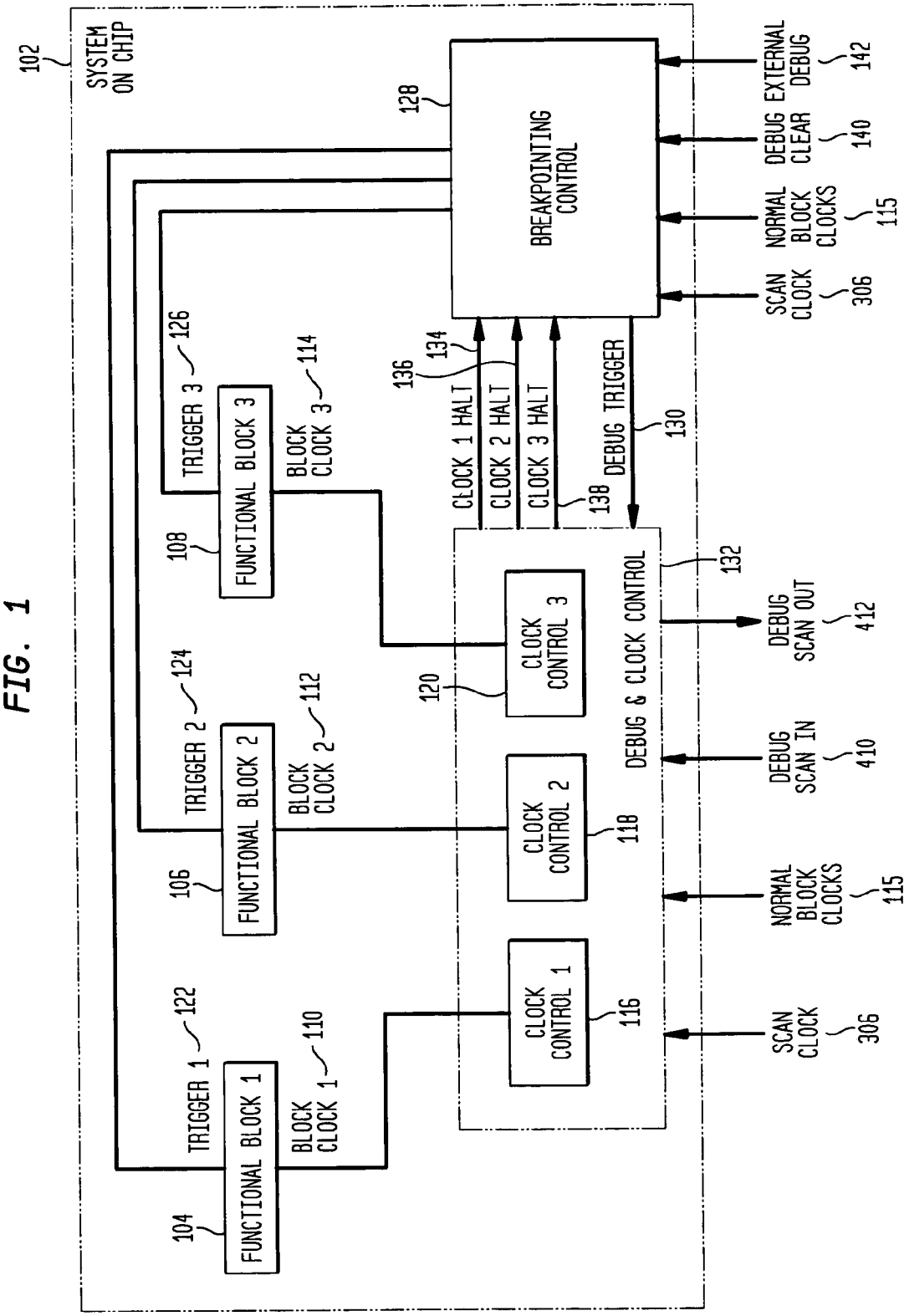
FIG. 1 is a block diagram of the interface to the breakpointing control circuitry in accordance with an embodiment of the invention.

FIG. 1 illustrates an interface for support of a breakpointing function for an SoC 102. As shown in FIG. 1, SoC 102 includes three functional blocks (104, 106 and 108). FIG. 1 is intended to be a simple example of an SoC as there frequently are far more functional blocks in a typical SoC. Each functional block is shown to be clocked off of a separate clock domain (block clock 1, block clock 2, and block clock 3; items 110, 112 and 114, respectively). There is also illustrated a separate clock control unit (clock control 1, clock control 2 and clock control 3; items 116, 118 and 120, respectively) for each clock domain. If two or more functional blocks share the same clock domain, the clock control unit also would be shared by these functional blocks. These clock control units receive as input a normal block clock signal (collectively, item 115) for each separate clock domain. As shall be further illustrated in FIGS. 2 and 3 below, these normal block clock signals are used to derive the respective block clock signal (110, 112 or 114).

Each functional block provides a trigger signal (trigger 1, trigger 2 and trigger 3; items 122, 124 and 126, respectively) to a breakpointing control block 128. As is well known in the art, these trigger signals monitor events occurring within the functional blocks that should cause the execution of the SoC to be halted. The breakpointing control block 128 uses the trigger signals to determine when to set the debug trigger signal 130 to the debug & clock control block 132.

The breakpointing control block 128 uses clock halt signals (clock 1 halt, clock 2 halt and clock 3 halt; items 134, 136 and 138, respectively) to determine when to allow the detection of new breakpointing events after the SoC has already entered debug mode. A debug clear signal 140 clears the circuitry in the breakpointing control block prior to resuming normal operation of the SoC. The external debug signal 142 allows unconditional halting of the SoC.

Figure 2:
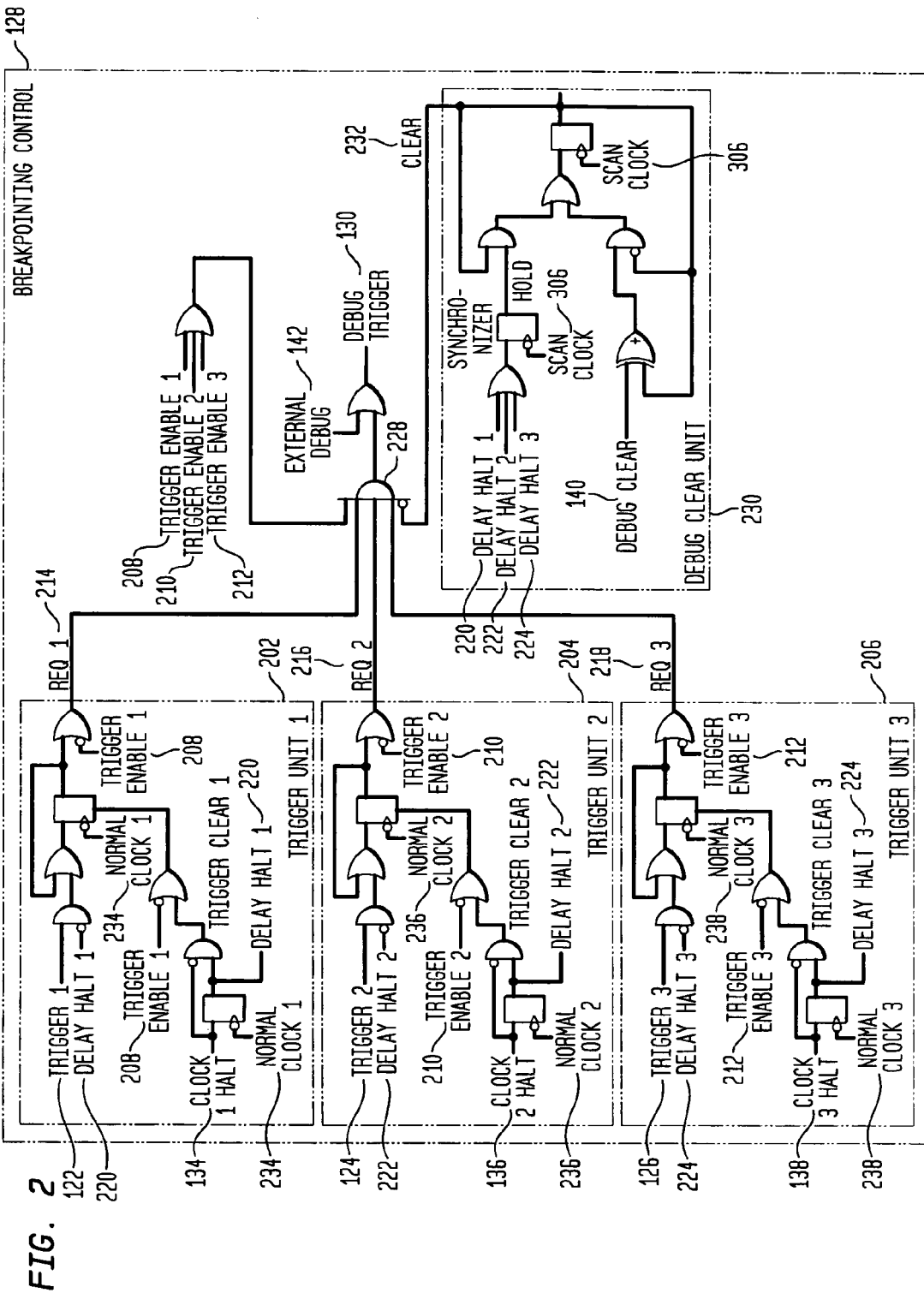
FIG. 2 is a block diagram of the breakpointing control logic in accordance with an embodiment of the invention.

FIG. 2 shows the control circuitry used in one embodiment of the invention to implement breakpointing on the SoC 102. FIG. 2 illustrates a trigger unit (trigger unit 1, trigger unit 2 and trigger unit 3; items 202, 204 and 206, respectively) for each separate clock domain in the SoC. In this example, each functional block has its own clock domain. Each trigger unit is enabled by a trigger enable signal (i.e. trigger enable 1 for trigger unit 1, trigger enable 2 for trigger unit 2, and trigger enable 3 for trigger unit 3; items 208, 210 and 212, respectively). Each trigger unit begins sampling the trigger signal (i.e. trigger 1 for trigger unit 1) after the unit is enabled. Once a breakpoint event has occurred, the trigger is latched within the appropriate trigger unit and the corresponding request line is activated (i.e., req 1 for trigger unit 1, req 2 for trigger unit 2 and req 3 for trigger unit 3; items 214, 216 and 218, respectively). This trigger unit maintains the active state of the request line until the appropriate clock halt signal is deactivated, indicating that the corresponding clock domain has returned to normal operation. When the clock halt signal is deactivated (i.e. clock 1 halt (item 134) for trigger unit 1 (item 202)), a pulse is generated to clear the latch in the trigger unit. Once the trigger unit is activated, the delay halt signal (items 220, 222 and 224) is generated to prevent further sampling of the corresponding trigger signal (items 122, 124 and 126).

The request lines (214, 216 and 218) from all the trigger units are gated together by gate 228 to allow conditional breakpointing. The debug trigger signal 130 is active only when the request lines from all enabled trigger units are activated. For a trigger unit that is disabled, the corresponding request line is active to prevent the deactivated trigger unit from interfering with the operation of enabled trigger units. If all the trigger units are disabled, the debug trigger signal will be prevented from activating thereby disabling any breakpointing function. The external debug signal 142 permits unconditional halting of the SoC.

A debug clear unit 230 clears the breakpointing control logic and returns the SoC to normal operation. As illustrated in FIG. 2, when the debug clear unit 230 encounters a debug clear signal 140, a clear signal 232 is activated to clear the debug trigger signal 130. Clearing the debug trigger signal 130 causes each clock domain to switch back to its normal clocking operation (that is, normal clock 1, normal clock 2 and normal clock 3 (items 234, 236 and 238 respectively) are enabled). The clear signal 232 remains active to prevent entering debug mode again until the previous breakpointing events are cleared. When all the delay halts signals (220, 222 and 224) are deactivated, the clear signal 232 is deactivated to allow the next set of breakpointing events to be recognized.

Figure 3:
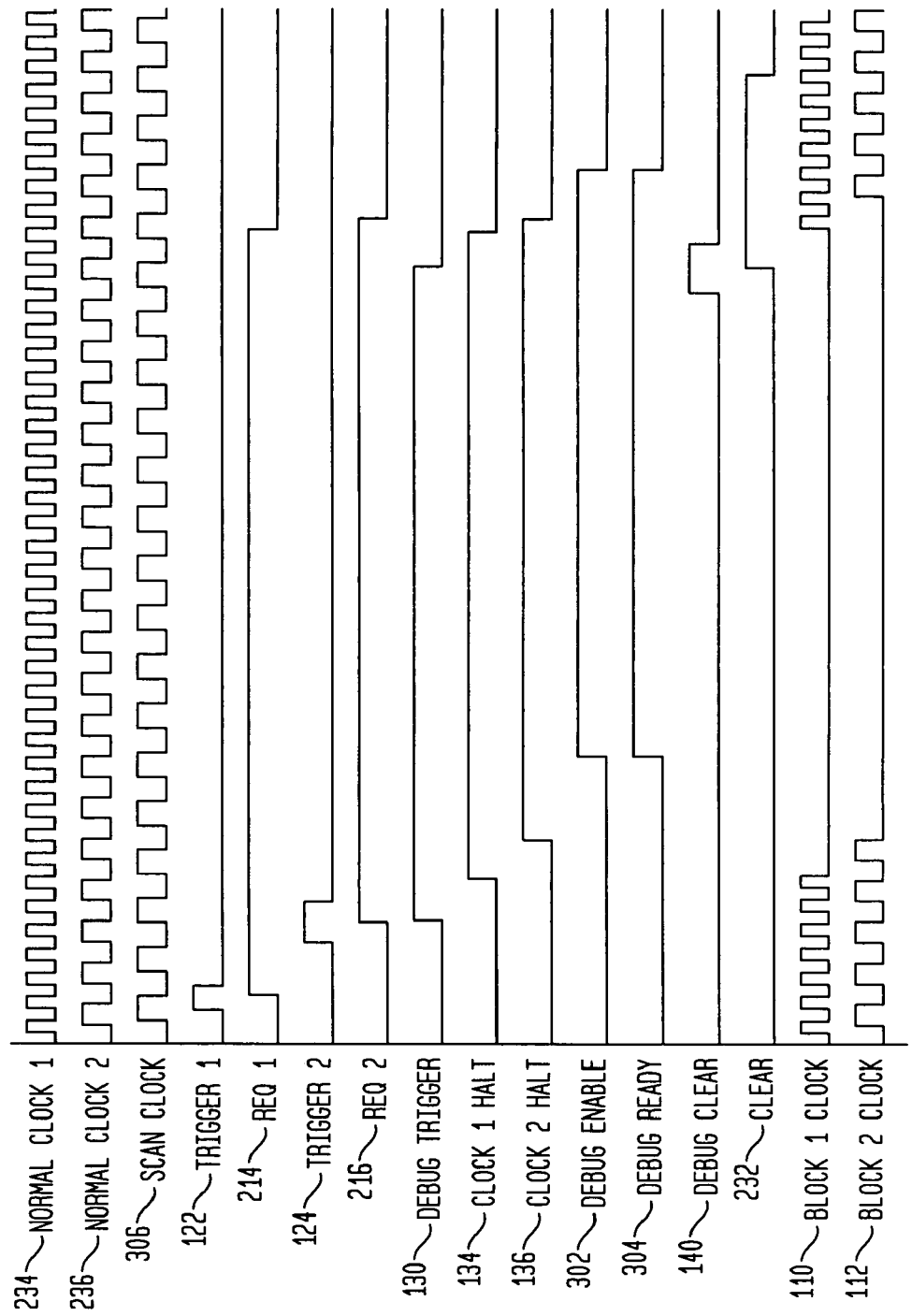
FIG. 3 is an illustration of an exemplary timing operation for breakpointing of SoC in accordance with an embodiment of the invention.

FIG. 3 illustrates and example of the timing operation for breakpointing of the SoC 102 in accordance with an additional embodiment of the invention. In this example, trigger unit 1 (item 202) and trigger unit 2 (item 204) are enabled. When the trigger 1 signal (item 122), which is synchronized to normal clock 1 (item 234), is activated, the corresponding request line (req 1, item 214) is activated. Only when the req 2 signal (item 216) is activated does the debug trigger signal 130 become active. The req 2 signal (item 216) is activated when the trigger 2 signal (item 124), which is synchronized to normal clock 2 (item 236), is activated.

All the clocks in the SoC (110, 112 and 114) are halted after the debug trigger signal 130 is activated. The clock halting process is further described in the above-referenced co-pending U.S. patent application entitled "System and Method for Debugging System-on-Chips". As illustrated in FIG. 3, the debug enable 302 and debug ready 304 signals are activated after synchronization to scan clock 306. When the debug ready signal 304 is active, this indicates to the system environment that the SoC 102 has entered debug mode, and the internal state of the device can be observed.

For simplicity, the clock 3 halt signal is not illustrated in FIG. 3. In this embodiment of the invention, the time at which the debug enable signal 302 is activated is determined by the slowest clock rate in the SoC 102.

When the SoC 102 is to resume normal operation, the debug clear signal 140 is triggered by the system environment (e.g., an input signal from a user or from a monitoring device), causing the clear signal 232 to be activated. At the same time that the clear signal is activated, the debug trigger signal 130 is deactivated. Clearing the debug trigger signal 130 causes the clocks to each of the different clock domains to be synchronized back to their normal clocks (234 and 236). The clear signal 232 remains active while the clocks to each of the different clock domains are re-synchronizing and while the trigger units (204, 206 and 208) in the breakpoint control logic are cleared. This prevents another breakpoint condition from occurring until the previous breakpoint condition has been cleared.

Figure 4:
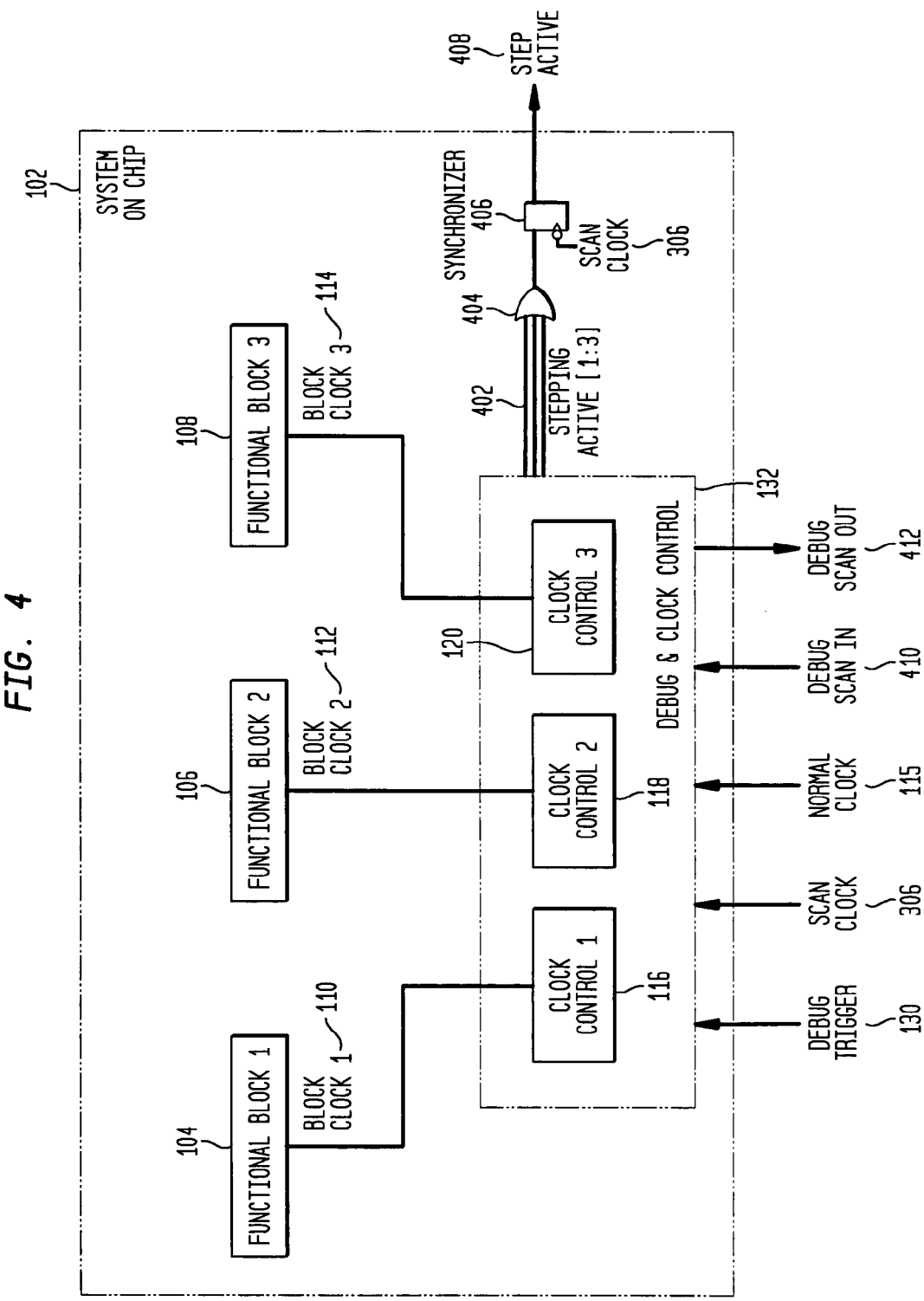
FIG. 4 is a block diagram of the interface to stepping control circuitry in accordance with an embodiment of the invention.

FIG. 4 illustrates an interface to support single or n-cycle stepping of a SoC 102 in an additional embodiment of the invention. FIG. 4 is similar to FIG. 1 discussed above and accordingly, similar item numbers are repeated. In particular, in this illustration there are three functional blocks, 104, 106 and 108. Each functional block is shown to be clocked off of a separate clock domain (block clocks 110, 112 and 114), and there is a separate clock control unit (clock controls 116, 118 and 120) for each corresponding clock domain. As discussed with respect to FIG. 1, if two or more functional blocks share the same clock domain, the clock control unit also would be shared by the associated functional blocks.

Each clock control unit (items 116, 118 and 120) produces an output signal (stepping active 1, stepping active 2 and stepping active 3; shown collectively as item 402) to indicate to the system environment when the clock control unit 132 is single or n-cycle stepping the corresponding clock domain. All of these outputs are gated by gate 404 and synchronized by synchronizer 406 before being sent as the signal step active 408 to the system environment.

The debug trigger signal 130 is used to force the SoC 102 into debug mode, as described further below with reference to FIG. 5. Normal clock 115 and scan clock 306 clock the clock domains when the SoC is running normally and in debug mode, respectively. The debug scan in 410 and debug scan out 412 signals are used by the system environment to load wait and run counters in the clock control units which will control the stepping operation of each clock domain.

Figure 5:
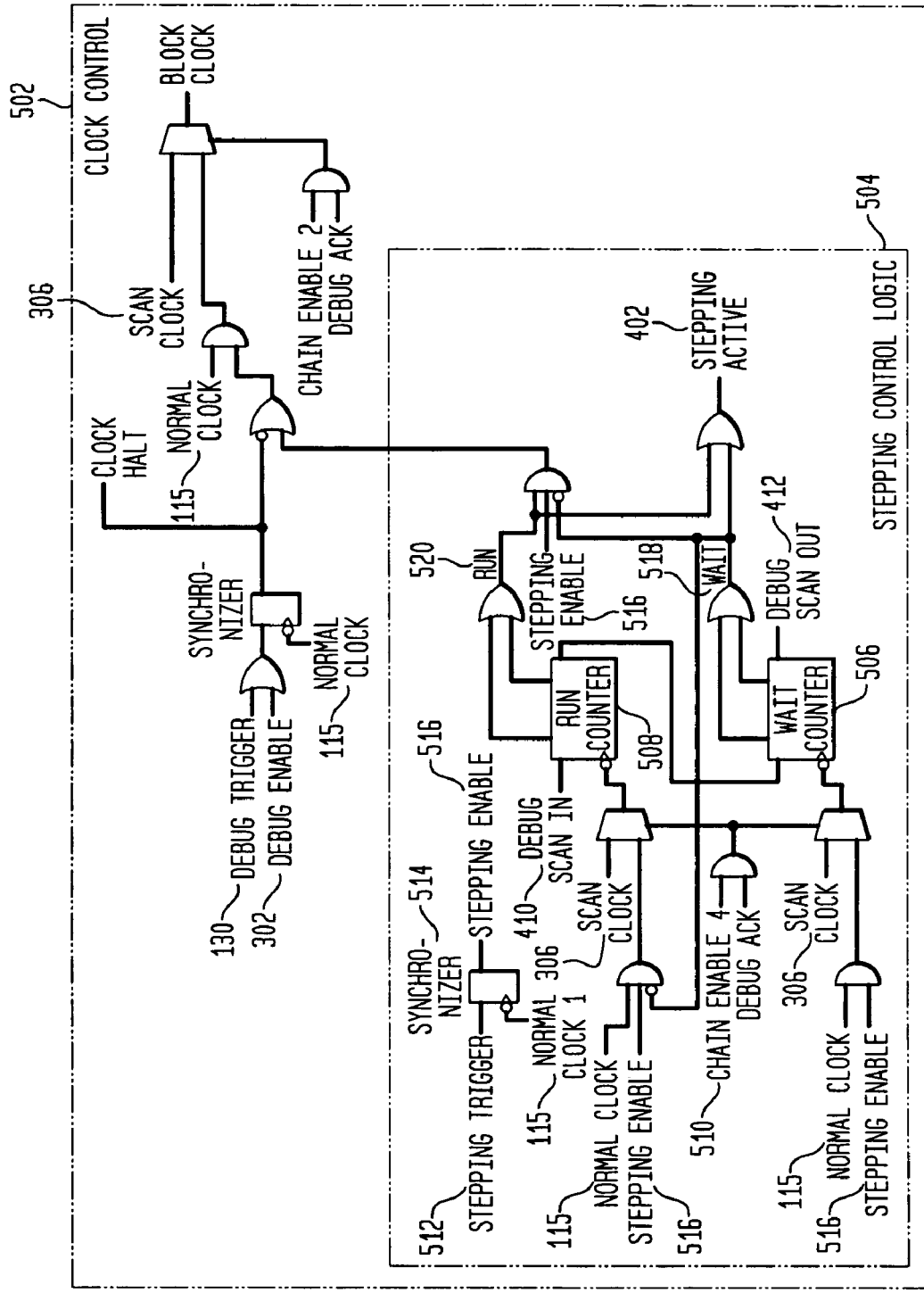
FIG. 5 is a block diagram of the clock control circuitry with stepping control logic in accordance with an embodiment of the invention.

FIG. 5 shows clock control circuitry 502 used in an additional embodiment of the invention to implement single and n-cycle stepping. The top portion of the clock control circuitry is used to place the SoC 102 in debug mode. Once in debug mode, the stepping control logic 504 controls single and n-cycle step execution.

The stepping control logic 504 (contained in each block control unit 116, 118 and 120) consists of two counters, wait counter 506 and run counter 508. The wait counter 506 adds delay before step execution occurs to allow alignment of different clock domains. The run counter 508 controls the number of clock cycles that the clock domain is stepped. Both counters are loaded with values in debug mode and then count down to zero, where they stop further counting. Loading the wait and run counters is identical to loading scan chains in debug mode, as described in the above-referenced co-pending U.S. patent application entitled "System and Method for Debugging System-on-Chips". The wait and run counters in all of the clock control units 116, 118 and 120 are loaded simultaneously. The example depicted in FIG. 5 shows signal chain enable 4 (item 510) as controlling the scan operation of the wait and run counters. Values for wait and run counters are scanned in through the debug scan in signal 410. The debug scan out signal 412 feeds the debug scan in signal 410 in an adjacent clock control unit (not illustrated).

After the wait and run counters for all the clock control units 116, 118 and 120 are loaded, stepping trigger signal 512 is used to start stepping execution of the SoC 102. This signal is synchronized by synchronizer 514 to the normal clock for each clock control unit, and the resulting stepping enable signal 516 is used to enable the normal clock to the wait and run counters. While the wait counter 506 is non-zero, the wait signal 518 is active, which prevents the run counter 508 from counting. After the wait counter 506 has counted to zero, the run counter 508 begins counting off the cycles of step execution in each clock domain. While the run counter 508 is counting down to zero, the run signal 520 is active, which forces the normal block clock 115 to be gated out of the clock control unit as block clock (e.g., as block clock 1, item 110). When the run counter 508 finishes counting down to zero, the clock control unit 132 returns to a state where the clock to each clock domain is halted.

Figure 6:
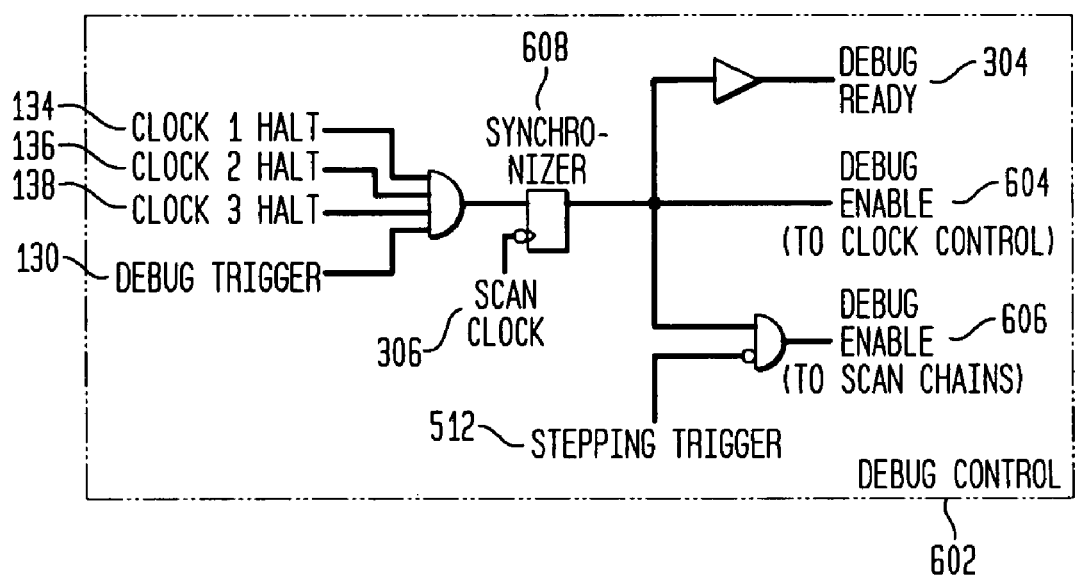
FIG. 6 is a block diagram of the debug control circuitry to support single and n-cycle stepping in accordance with an embodiment of the invention.

FIG. 6 illustrates debug control circuitry 602 which controls single and n-cycle stepping in accordance with a further embodiment of the invention. As shown in FIG. 6, there are two distinct debug enable signals, indicated as items 604 and 606. Debug enable signal (to clock control) 604 places the clock control circuitry in debug mode. Accordingly, the debug enable signal 604 should always remain active in debug mode to keep the device in debug mode. Debug enable signal (to scan chains) 606 is used to activate the scan mode of scan chains in the functional blocks and clock control units. While in debug mode, the default is to select scan mode operation of scan chains to allow cell contents to be scanned in and out. For single and n-cycle stepping, this signal should revert to the normal operation of registers. As illustrated in the embodiment of FIG. 6, the stepping trigger signal 512 gates the debug enable signal 606 to allow single and n-cycle stepping of the SoC 102.

For simplicity, omitted from FIGS. 5 and 6 is the presence of a power-up reset signal that is input to synchronizers (items 514 and 608, respectively), thereby resulting in a "0" output signal from said synchronizers. Further, with respect to FIG. 5, this power-up reset signal is supplied to run counter 508 and wait counter 506 to cause them to reset to "0". Use of such a reset signal is well-known in the prior art. Its use in the present invention ensures that the debug logic is not active at the time the system is powered up.

FIG. 7 illustrates timing operations for n-cycle stepping of the SoC 102 according to one embodiment of the invention. The sequence to place the SoC in debug mode is identical to the procedure described in the above-referenced co-pending U.S. patent application entitled "System and Method for Debugging System-on-Chips". Accordingly, once in debug mode, the internal state of the SoC 102 can be monitored by the debugging process described in that disclosure.

When the user is ready to single or n-cycle step the execution of the SoC 102, the wait and run counters in all the clock control units are loaded. The chain select signal 702 is set to 4, which in this example corresponds to the scan chain consisting of all the wait and run counters chained together. The debug ack signal 704 is pulled high to load the scan chain in the same manner as when loading new states into the scan chains in the functional blocks as described in the above-referenced co-pending U.S. patent application entitled "System and Method for Debugging System-on-Chips". If a non-zero value is loaded in the wait counter 506, the corresponding wait signal 518 will go high, as the wait 2 signal 706 illustrates in FIG. 7. Loading the run counter 508 with a value of one, will correspond to single-cycle stepping of the corresponding clock domain.

When the system environment is ready to single or n-cycle step the SoC 102, the stepping trigger signal 512 is activated. This signal is synchronized to the normal clock of each clock domain to generate an unique stepping enable signal 516 for each clock control unit. A delay of 0 to m (m being a positive integer) normal clock cycles occurs to align the different clock domains before the wait 2 signal 706 is deactivated. Then, 0 to n (n being a positive integer) normal clock cycles occur 708 to step the execution of the corresponding clock domain.

The step active signal 408 shown in FIG. 7 is the combination of the different stepping active signals 402 for all the clock control units (items 116, 118 and 120) as shown in FIG. 4. The system environment can monitor the step active signal 408 to determine when step execution has completed. At this point, the system environment pulls the stepping trigger signal 512 low to disable the stepping control logic. There is a synchronization delay before the stepping enable signal 516 in the clock control unit is disabled; however, the internal state of the scan chains in functional blocks can be immediately scanned for debugging purposes. By the time the internal state of the device has been monitored, the clock control units will be ready to be configured for the next stepping operation.

Figure 8A:
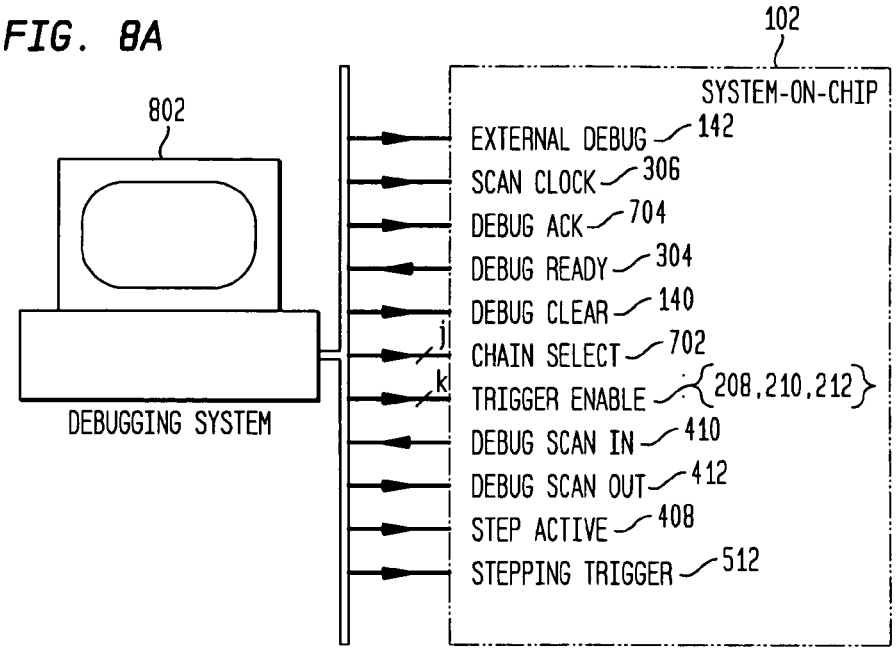
Figure 8B:
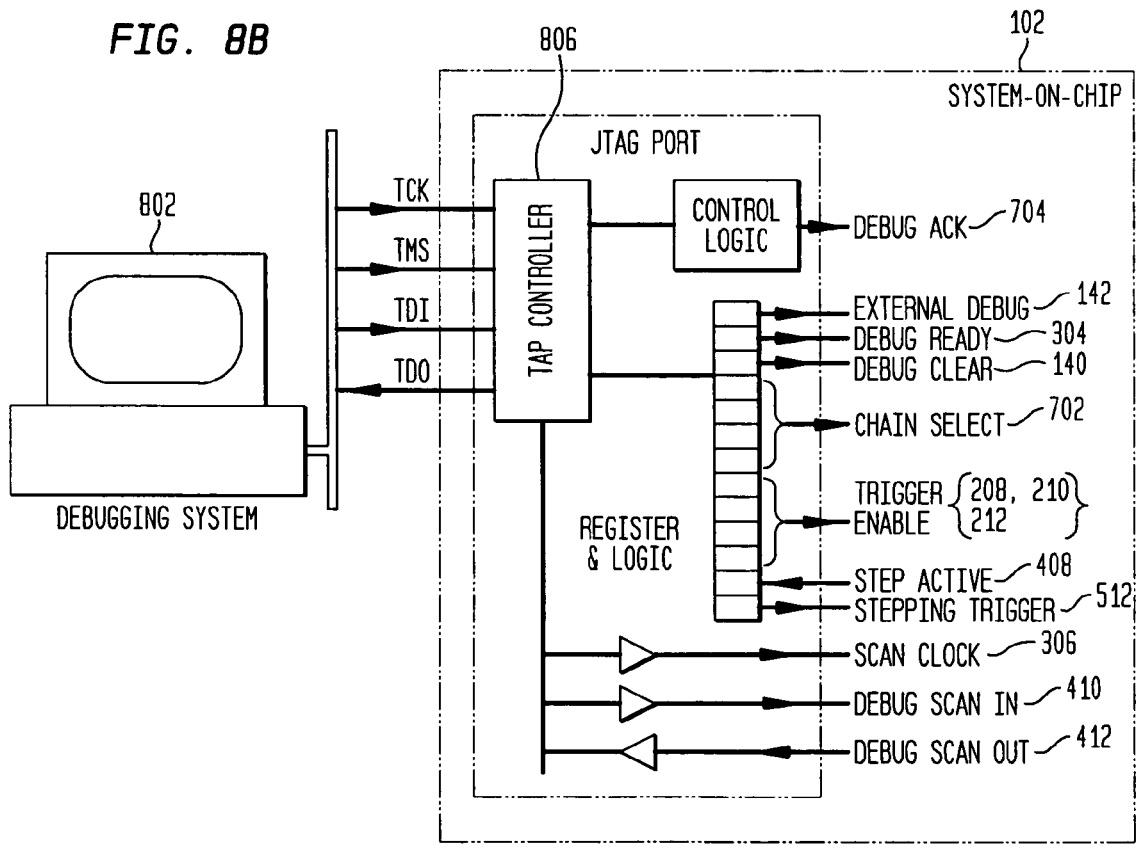

FIGS. 8A and 8B each illustrate an additional embodiment of the invention in which a debugging computer system 802 receives as inputs various signal conditions described above and also supplies various inputs to the SoC 102. These signals are bit wide with the exception of chain select, whose width is dependent on the number of scan chains in the system-on-chip.

As illustrated in FIG. 8A, if there are adequate pins present on the SoC 102, the controlling signals can be connected as dedicated pins on the system-on-chip. Otherwise, and as illustrated in FIG. 8B, the controlling signals can be connected to a serial test interface, such as the IEEE 1149.1 JTAG tap controller 806, to reduce pin count. The hook-up to a serial test interface is a well-known industry practice.

In additional embodiments of the invention, the debugging system can comprise test equipment or a computer that is used to control the debugging process as illustrated in the timing diagrams depicted in FIGS. 3 & 7 of the present application. The debugging system 802 periodically monitors the debug ready signal 304. When the debug ready signal 304 is active, the debugging system 802 recognizes that the SoC 102 has entered debug mode, either due to the reaching of a preset breakpoint or the triggering of the external debug input pin 142. After the available internal state conditions of the SoC 102 have been read into the debugging system 802, the debugging system's software provides the user with control over the next execution state of the SoC. In particular, the debugging system 802, through the debug scan in signal 410, can set run counter 508 and wait counter 506 to appropriate values to cause the SoC 102 to step and execute in a desired fashion. As such stepping occurs, the available internal states are again available as input to the debugging system 802.

Software in the debugging system allows the user to efficiently process the internal state information so obtained from the SoC. The debugging system permits the user to concurrently run a software model of the SoC, enabling the user to debug by comparing the expected operation of the SoC with the actual operation of the device. The software also has the capability of pattern detection, thereby enabling the user to detect when the contents of viewable registers or a subset of these registers have a certain state. The debugging system can be programmed to automatically check the available states of the SoC at periodic intervals and compare these run states with expected values.

The above-described steps can be implemented using standard well-known programming techniques. The novelty of the above-described embodiment lies not in the specific programming techniques but in the use of the steps described to achieve the described results. In a client/server environment, such software programming code may be stored with storage associated with a server. The software programming code may be embodied on any of a variety of known media for use with a data processing system, such as a diskette, or hard drive, or CD_ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

It will be understood that the forgoing description of the invention is by way of example only, and variations will be evident to those skilled in the art without departing from the scope of the invention, which is as set out in the appended claims.

What is claimed is:

1. A method for debugging a system-on-a chip (SoC), the SoC comprising system components to include at least a first functional block and a second functional block, said first function block being controlled by a first block clock and a first clock control unit and said second function block being controlled by a second block clock and a second clock control unit, the method comprising steps of:
   setting a first breakpoint on a first specific event occurring on said first functional block;
   monitoring events occurring on the SoC;
   recognizing occurrence of the first specific event on said first functional block;
   providing, responsive to said recognizing, a debug trigger signal to both said first and second clock control units;
   halting, responsive to said debug tringer signal, both said first and second block clocks;
   determining states of one or more of said system components using a scan clock; and,
   utilizing said states to debug the SoC.

2. The method of claim 1 in which the first specific event is an instruction that occurs within said first functional block and further comprising setting a second breakpoint on a second specific event occurring on said second functional block and wherein recognizing further comprises recognizing occurrence of the second specific event on said second functional block.

3. The method of claim 2 further comprising step of generating a debug ready signal indicating to a user that an internal state of the SoC can be observed.

4. The method of claim 3 wherein at least one of said first and second functional blocks comprises at least one scan chain, and said determining step comprises steps of:
   selecting from said at least one scan chain, a selected scan chain containing at least one register element; configuring each of the at least one register element in said selected scan chain to contents required for scan mode; providing a scan clock signal to control the selected scan chain; and, shifting out the contents of said at least one register element in the selected scan chain.

5. The method of claim 1 further comprising steps of:
   recognizing a debug clear signal triggered by the system components and
   restoring operation of each block clock.

6. The method of claim 1 wherein said first clock control circuit further comprises a first run counter and a first wait counter and said second clock control circuit further comprises a second run counter and a second wait counter and comprising steps of:
performing a single step execution of the SoC using said first and second wait counters to add delays to allow timing alignment of said first and second functional blocks; and,
redetermining the states of said one or more of said system components.

7. The method of claim 6 further comprising steps of:
performing an n-cycle step execution of the SoC where n is a positive integer; and
redetermining the states of said one or more of said system components after execution of one or more of said n-cycle steps.

8. The method of claim 7 wherein at least one of said functional blocks comprises at least one scan chain, and said determining step comprises steps of:
selecting from said at least one scan chain, a selected scan chain containing at least one register element;
configuring each of the at least one register element in said selected scan chain to contents required for scan mode;
providing control of the scan chain to a scan clock signal; and,
shifting out the contents of the at least one register element in the selected scan chain.

9. The method of claim 6 further comprising steps of:
performing an n-cycle step execution of only one block where n is a positive integer; and,
redetermining the states of said one or more of said system components after execution of one or more of said n-cycle steps.

10. An apparatus for debugging a system-on-a chip (SoC), the SoC comprising system components to include at least a first functional block and a second functional block, said first function block being controlled by a first block clock and a first clock control unit and said second function block being controlled by a second block clock and a second clock control, the apparatus comprising:
a first controller that recognizes a first specific event occurring on said first functional block;
a second controller that, responsive to said recognition of said first specific event, provides a debug trigger signal to said first and second clock control units;
a third controller that halts said first and second block clocks upon detection of the presence of the debug trigger signal; and,
a circuit that outputs states of one or more of said system components usina a scan clock;
wherein said states are utilized to debug the SoC.

11. The apparatus of claim 10 in which the first specific event is an instruction that occurs within said first functional block and wherein said first controller further recognizes a second specific event occurring on said second functional block and wherein said second controller provides said debug signal responsive to recognition of both said first and second specific events.

12. The apparatus of claim 11 further comprising a circuit that generates a debug ready signal indicating to a user that an internal state of the SoC can be observed.

13. The apparatus of claim 12 wherein at least one of said functional blocks comprises at least one scan chain, and said circuit that outputs states comprises:
a circuit that selects from said at least one scan chain, a selected scan chain containing at least one register element;
a circuit that configures each of the at least one register elements in said selected scan chain to contents required for scan mode;
a circuit that provides a scan clock signal to control the selected scan chain; and
a circuit that shifts out the contents of said at least one register element in the selected scan chain.

14. The apparatus of claim 10 further comprising:
a circuit that recognizes a debug clear signal triggered by the system componants; and,
a circuit that restores operation of each block clock.

15. The apparatus of claim 10 wherein said first clock control circuit further comprises a first run counter and a first wait counter and said second clock control circuit further comprises a second run counter and a second wait counter further and further comprises a step circuit that-performs a single step execution of the SoC using said first and second wait counters to add delays to allow timing alignment of said first and second functional blocks.

16. The apparatus of claim 15 wherein
said step circuit performs an n-cycle step execution of the SoC, where n is a positive integer; and,
said circuit that outputs states comprises a circuit that re-outputs the states of said one or more of said system components after execution of one or more of said n-cycle steps.

17. The apparatus of claim 16 wherein at least one of said functional blocks comprises at least one scan chain, and said circuit that outputs states further comprises:
a circuit that selects from said at least one scan chain, a selected scan chain containing at least one register element;
a circuit that configures each of the at least one register element in said selected scan chain to contents required for scan mode;
a circuit that provides a scan clock signal to control the selected scan chain; and
a circuit that shifts out the contents of said at least one register element in the selected scan chain.

18. The apparatus of claim 10 further comprising:
said first controller recognizes an additional specific event occurring on the SoC;
wherein only if a predetermined condition is met with respect to said specific event and said additional specific event, does the operation of each of said second controller, said third controller and said circuit that outputs states occur.

19. The apparatus of claim 10 further comprising:
a circuit that performs an n-cycle step execution of only one of said functional blocks where n is a positive integer; and
said circuit that outputs states comprises a circuit that re-outputs the states of said one or more of said system components after execution of one or more of said n-cycle steps.

* * * * *